United States Patent [19]

Wu

[11] 4,296,479
[45] Oct. 20, 1981

[54] METHOD FOR OPTICAL RECORDING IN PHOTO-DICHROIC GLASS SURFACES

[75] Inventor: Che-Kuang Wu, Horseheads, N.Y.

[73] Assignee: Corning Glass Works, Corning, N.Y.

[21] Appl. No.: 94,364

[22] Filed: Nov. 15, 1979

[51] Int. Cl.³ .............................................. G11C 13/04
[52] U.S. Cl. ................................... 365/119; 365/121
[58] Field of Search ............... 365/119, 120, 121, 122, 365/218

[56] References Cited

U.S. PATENT DOCUMENTS 3,727,194  4/1973  Schneider ........................... 365/119

OTHER PUBLICATIONS

Schneider, "Simplified Technique for Storing Information in Photodichroic Alkali Halide Crystals", *Applied Optics*, vol. 11, No. 6, 6/72, pp. 1426-1427.
Haskal et al., "Subnanosecond Laser Recording on MnBi Thin Films", *Applied Optics*, vol. 13, No. 4, 4/74, pp. 866-868.

Primary Examiner—Stuart N. Hecker
Attorney, Agent, or Firm—Clinton S. Janes, Jr.

[57] ABSTRACT

The instant invention is directed to a method for writing and erasing images in the surface of a photosensitive glass which demonstrates photoanisotropic behavior at a mega Hz or higher rate. This is accomplished by utilizing an erasing beam of linearly-polarized red light having about a 45° change in the direction of polarization from that of the writing beam. Also, this invention provides a method for preventing the alteration of an image written into said glass surface, the method involving exposing the area of the image to ultraviolet radiation.

6 Claims, 4 Drawing Figures

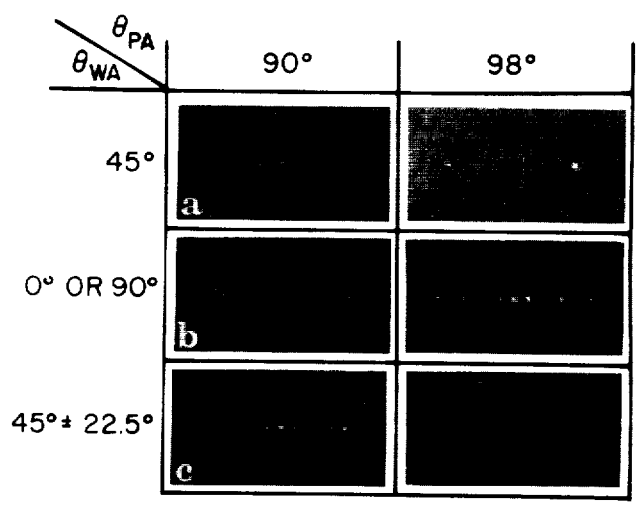
Fig. 2
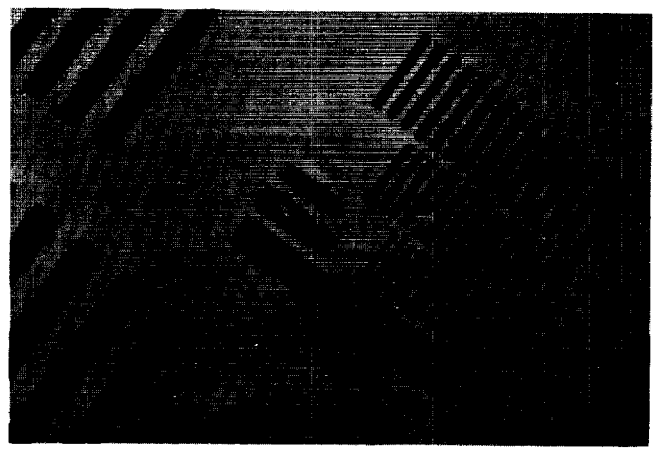
Fig. 3
Fig. 4

METHOD FOR OPTICAL RECORDING IN PHOTO-DICHROIC GLASS SURFACES

BACKGROUND OF THE INVENTION

U.S. application Ser. No. 924,508, filed July 14, 1978 by the present applicant, now U.S. Pat. No. 4,191,547 discloses photo-sensitive glass compositions which demonstrate alterable photo-anisotropic effects, i.e., the glasses display photo-dichroic and photo-birefringent effects. Moreover, it was observed that polarization of those two effects could be reversibly altered between two arbitrarily chosen directions without apparent fatigue. Stated another way, those phenomena could be reversibly altered seemingly indefinitely with no substantial change in results. A specific utility disclosed for those inventive glasses was as optical recording media. Thus, that application describes the use of such compositions as a photosensitive optical information storage medium. Hence, the photo-anisotropic behavior exhibited by the glass permitted the storage of optical information therein.

The basis of that invention was the discovery that up to 25% by weight silver could be introduced into a surface layer of about 1–500 microns thickness in certain hydrated glass bodies of closely-defined compositions within the $Na_2O$ and/or $K_2O$-$ZnO$-$Al_2O_3$-$SiO_2$-$Cl$ field by means of an aqueous solution ion exchange reaction. That all or essentially all of the silver included in the thin, ion-exchanged surface layer is present in the ionic state is evidenced from the transparent, substantially colorless appearance of the integral surface layer.

The method disclosed for producing such bodies comprised three general steps:

(1) An anhydrous glass body consisting essentially, in mole percent on the oxide basis, of about 70–82% $SiO_2$, 10–17% $Na_2O$ and/or $K_2O$, 5–15% $ZnO$, 0.5–5% $Al_2O_3$, and 0.1–3% $Cl$ is formed.

(2) That glass body is contacted with an aqueous solution containing $Ag^+$ ions acidified with an acid to a pH less than about 2 at a temperature in excess of 200° C. and at a pressure in excess of 225 psig for a period of time sufficient to hydrate a surface layer thereon containing up to about 10% by weight $H_2O$ and to effect the replacement of $Na^+$ and/or $K^+$ ions with $Ag^+$ ions in the hydrated glass, the proportion of $Na^+$ and/or $K^+$ ions in the hydrated glass being less with a corresponding increase in $Ag^+$ and/or $H^+$ ($H_3O^+$) ions. The $Ag^+$ ions react with $Cl^-$ ions in the hydrated glass to bring about the formation of Ag-AgCl-containing crystals which impart photosensitivity to the glass.

(3) The hydrated, photosensitive surface layer is subjected to ultraviolet radiation at an intensity and for a period sufficient to develop photo-anisotropic properties therein.

With respect to the use of those glasses as optical recording materials, that application explicitly teaches that the optimum optical density demanded for optical recording can be secured in an ion-exchanged layer having a thickness greater than about 5 microns, and that the minimum spot size diameters which can be recorded in the surface layer employing a Gaussian beam at about 633 nm is 1.6 microns.

SUMMARY OF THE INVENTION

The instant invention is founded in the above-described disclosure and encompasses three developments resulting from further laboratory work with the glasses set forth in that disclosure. Thus, thus extended research activity has evolved processes not contemplated in that earlier disclosure which, when applied to those glasses, yield products also not envisioned in that earlier disclosure.

For example, in known materials for optical recording, erasability and permanency of the recorded information do not co-exist. Nevertheless, the photo-anisotropic glasses of that earlier disclosure can be treated in a manner such that the physical effect of recording in the glass surface is irreversible and the inherent erasibility of the glass surface does not destroy the permanency of a recorded image. That is, an erased 1-bit can always be distinguished from 0-bits utilizing a different read mode.

Further, a method of optical recording has been devised which allows spot sizes as small as 0.25 micron to be recorded in the surfaces of those glasses.

Finally, the glasses of that disclosure can be treated in such a manner as to prevent later alterations, e.g., 0-bits to 1-bits and/or 1-bits to erased 1-bits, after recording and error corrections have been completed.

Those developments will be discussed and illustrated in more detail in the following textual description of the inventive subject matter and in the appended drawings.

BRIEF DESCRIPTION OF THE DRAWINGS

FIGS. 2a–2f are photographs illustrating the images of 1-bits and 45° erased 1-bits in the extinction read mode as well as in the modified extinction read modes.

FIG. 3 consists of two photographs depicting images placed in the surface of photo-dichroic glasses utilizing a modified extinction read mode to increase the transmittance of the recorded spots.

FIG. 4 is a photomicrograph of a contact printed, ultraviolet-darkened, test target.

GENERAL DESCRIPTION OF THE INVENTION

Figure 1:
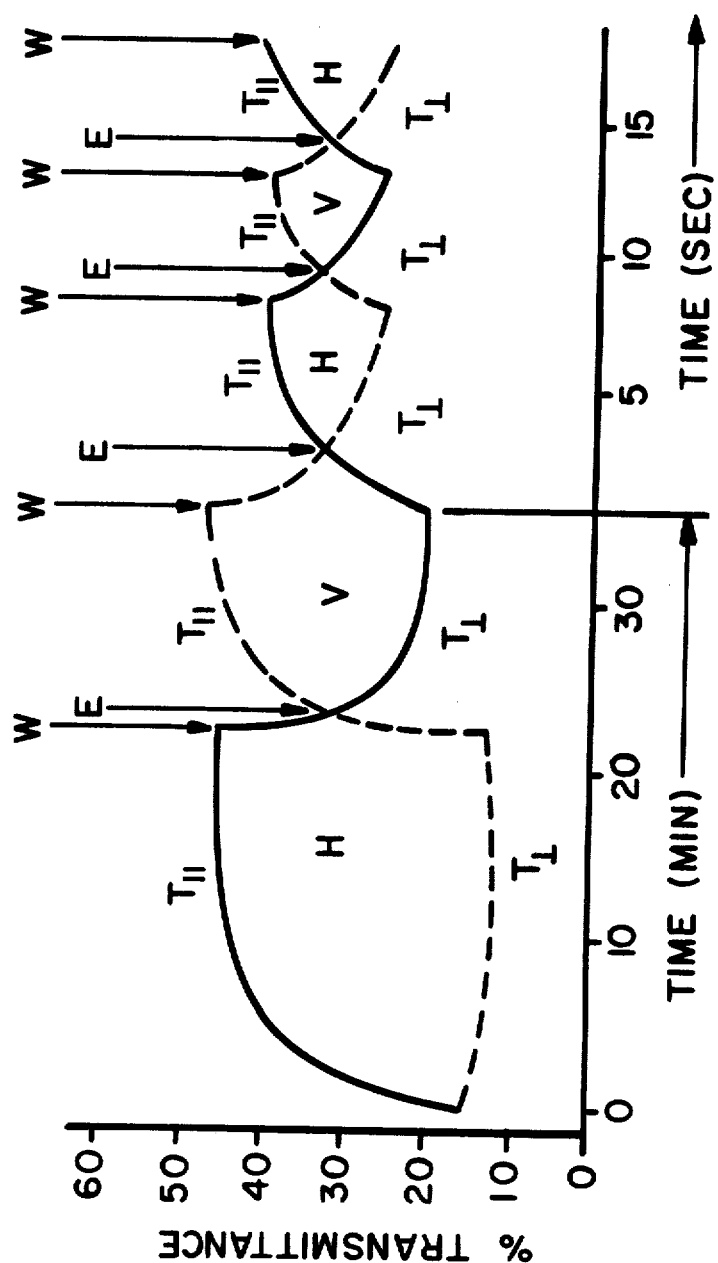
FIG. 1 is a graphical representation of a preconditioning process applied to the photo-dichroic glass surface followed by 90° erase-write cycling.

Method of Erasure and Detection of Erasure

U.S. application Ser. No. 924,508, supra, illustrated that the writing sensitivity of the thereindescribed photo-dichroic glass surfaces can be enhanced through a few cycles of preconditioning. This circumstance is exhibited in FIG. 1. In a preconditioning cycle, the sample is subjected to linearly-polarized red light having a wavelength of about 600–650 nm, e.g., 647.1 nm employing a krypton gas laser or 632.8 nm utilizing a He-Ne gas laser polarized in the horizontal direction. After the sample has been bleached sufficiently to achieve a desired photo-dichroic effect, the polarization of the exposing red light is switched to the vertical direction. When the preconditioning cycle, i.e., the bleaching cycle, is repeated, the energy density demanded to rotate the polarization of the bleached spot in the glass sample is sharply reduced (up to 10 fold), provided that the required dichroic absorption difference is no more than about 2 db at the absorption peak.

Thus, FIG. 1 presents a preconditioning process followed by 90° erase-write cycling. The diameter of the spot on the glass surface exposed to the bleaching beam was 1 cm and the intensity of the beam was 0.1 watt/cm². P represents the polarization direction of the linearly-polarized red light. H and V denote horizontal and vertical directions, respectively, and E and W designate erased and written states, respectively. $T_{11}$ signifies the transmittance of the dichroic area of the glass surface in the polarization direction parallel to that of the bleaching (write or erase) beam. $T_\perp$ indicates the transmittance of the dichroic area of the glass surface in the polarization direction perpendicular to that of the bleaching beam. The data graphically reported in FIG. 1 were obtained through monitoring with conventional instrumentation the transmittances of $T_{11}$ and $T_\perp$ as the sample was being bleached. It must be observed in FIG. 1 that the time scale changes from minutes to seconds after the initial preconditioning cycle.

Because of the reaction mechanism underlying optical recording upon photo-dichroic glass surfaces, the image written thereon can be erased by re-exposing the image with polarized light of a different orientation. Expressed in another way, erasing is achieved by re-exposing a recorded spot with a different orientation of the polarization of the write beam. This can be accomplished through either a 45° or 90° change in the direction of polarization. The polarization of the write beam can be arbitrarily chosen since the alignment of the transition is not along a crystalline axis. And, since a write-erase cycle is equivalent to a preconditioning cycle, the initial cycles of write-erase enhance the writing sensitivity. This circumstance holds true particularly in those instances where the required contrast to read is minimal.

It will be appreciated that, to erase an image in the photo-dichroic surface with a 90° change in the polarization direction, it is necessary to control the erasing energy density so precisely that $T_{erased}$ 1-bit$=T_{0\text{-}bit}$ in the extinction read at least at $\lambda_{read}$. Thus, excessively long exposure to the 90° erasing beam will again promote transmission of the beam through crossed polarizers. As noted previously, W and E in FIG. 1 designate written and erased states, respectively, where a read beam of 633 nm is employed. For the purpose of presenting a simple illustration, it has been assumed in FIG. 1 that at the read wavelength $\lambda_{read}$, $n_{11}=n$ as $T_{11}=T_\perp$. It must be realized, however, that this assumption is not always valid, since $n_{11}$-n at $\lambda_{read}$ is a function of $T_{11}$ and $T_\perp$ at all wavelengths and is not determined by $T_{11}$ at $\lambda_{read}$ and $T_\perp$ at $\lambda_{read}$ alone. As can be observed in FIG. 1, the energy density required for erasing is only about one-third of that required for writing, where a 90° change in polarization direction is utilized to erase a recorded image.

In certain applications, write-erase cycles of very high speed would be highly desirable. It is apparent that, where the application requires the capability to write and erase images at a mega Hz or higher rate, the use of about a 45° change in polarization direction to erase is more convenient than the above-described 90° change. Hence, in utilizing a 45° change in polarization direction, the hazard of over-erasure, leading to transmission through the crossed polarizers, is eliminated. Laboratory study has indicated that the energy density required for erasure with a 45° change in polarization direction is about 3-10 times that required for writing.

FIG. 2 photographically sets forth images of recorded spots in several write-erase operations utilizing a 45° change in polarization direction as the erasure means. Three sets of three spots (written images of about 5 micron diameter) were placed in the surface of a plate of photo-dichroic glass. The middle spot in the first set (looking from left to right across the sample) of three spots was erased after it was recorded, this erasure being undertaken through re-exposure thereof to the write beam whose direction of polarization has been rotated 45° with respect to the initial polarization direction. The center spot in the second set of three spots is write-erase cycled five times and ends in the written state. The middle spot in the third set of three spots is write-erase cycled five times and ends in the erased state. $\theta_{PA}$ represents the angle between the optic axis of polarizer and analyzer and $\theta_{WA}$ indicates the angle between the polarization direction of the written state and the analyzer. FIG. 2a shows the image of the recorded spots (nine spots) in the normal extinction read mode. The spots in the written state (seven spots) appear as bright spots in a dark background, whereas the two spots in the erased state are invisible.

The recorded spots take on an appearance which is different from that in FIG. 2a when the mode of read is modified from the normal extinction read. FIGS. 2b-2f depict several such changes in appearance.

For example, FIG. 2b illustrates the behavior resulting when the optic axis of both the polarizer and analyzer are rotated 45°, i.e., keeping $\theta_{PA}$ at 90° with $\theta_{WA}$ being either 0° or 90°. As can be seen, the seven spots of FIG. 2b in the written state become invisible and the two spots of FIG. 2b in the erased state appear as bright spots in a dark background.

In FIG. 2c, the optic axis of both the polarizer and the analyzer is rotated 22.5°, i.e., $\theta_{WA}=45°\pm22.5°$. All of the recorded images appear as bright spots in a dark background with the brightness of each recorded spot being proportional to the accumulated energy density received by the images from all the write and erase operations.

The images of the recorded spots in FIGS. 2d, 2e, and 2f, respectively, may be derived from those of FIGS. 2a, 2b, and 2c, respectively, via the following alterations:

(1) lighten the background;
(2) change bright spots to dark spots; and
(3) change invisible spots to bright spots.

Each of those modifications in appearance of the recorded spots can be accomplished by opening the angle $\theta_{PA}$, e.g., from 90° to 98°.

Consequently, it is apparent, when comparing FIGS. 2a-2f, that since one of the modified extinction modes of read, or a combination of them, can be employed to distinguish a 0-bit from an erased 1-bit. This alterable recording capability of the material recommends its utility for the storage of permanent information as, for example, in archival applications.

Deviation of $\theta_{PA}$ from 90° self-evidently decreases the effective extinction ratio of the polarizer-analyzer and causes a lightening of the background of the recorded images. Nevertheless, closing angle $\theta_{PA}$ results in a different effect on the appearance of the recorded spots from that occurring when angle $\theta_{PA}$ is opened.

The effect of closing angle $\theta_{PA}$, while keeping angle $\theta_{WA}$ at 45°, is illustrated in FIG. 3. The dichroic spots appearing there on a plate of photo-dichroic glass, ranging in size from 2.5 microns to somewhat less than 5.5 microns in the radius of the central disc, were recorded with an objective lens of 0.07 numerical aperture (NA). The pulse durations of the laser beam (632.8 nm) for the six sets of three spots (looking from left to right across the glass) were 50$\mu$ sec, 10$\mu$ sec, 5$\mu$ sec, 3.5$\mu$ sec, 2$\mu$ sec, and 1$\mu$ sec, respectively, with the surface power density, i.e., the intensity of the write beam impinging upon the glass surface in the focal plane thereof, being 40 kwatt/cm$^2$. When the duration of the pulse exceeds 10μ sec, diffraction rings appear in the recorded spots. Even longer pulse times, however, do not seem to cause any substantial increase in the radius of the central disc. The radii (r) of the spots produced with the 1μ sec and 5μ sec pulses are 2.5 microns and 3.75 microns, respectively, as viewed between crossed polarizers under a microscope with a conventional noncoherent light source. For comparison, the first null ring radius of the recording beam in the focal plane thereof is 5.5 microns. It has been determined that the relationship between the observed spot size and the required writing energy density is to a large extent independent of the numerical aperture of the focussing lens, when the radius of the spot is expressed in the dimensions coordinate $(2\pi/\lambda)$ (NA) r.

As has been noted above, erasability and permanency of recorded information do not customarily co-exist. It has been found, however, that the erasing capability of the photo-dichroic glass surface does not destroy the permanency of the recorded image. Hence, it is possible to distinguish the recorded spots, e.g., 1-bits, and erased 1-bits, from the unrecorded spots (0-bits) or area, even if the written spots have been erased. This has been discussed previously with respect to FIG. 2.

To cause the recorded images to revert back to their original isotropic state, it is necessary to achieve the conditions of $T_{erased\ 1\text{-}bit} = T_{0\text{-}bit}$ and $T_{11} = T_\perp = T_o$ at all wavelengths. $T_o$ designates the transmittance of the isotropic photo-dichroic glass surface after being darkened by ultraviolet radiation and before being exposed to a polarized beam of red light. Those conditions can never be achieved even when erasure is accomplished utilizing a 90° change in polarization direction, because each recorded image contains a large variety of color centers having different absorbing and bleaching characteristics at any particular wavelength that may be selected as the write, read, or erase beam. As a result, the recorded spot is not reversible to an isotropic state, although it is erasable and alterable. Stated in another way, the recorded images are permanently different from areas not exposed to the write beam. Moreover, any alteration after the first recording of an image can be detected.

This latter circumstance gives rise to a special utility for their materials, viz., the storage of confidential documents. For example, a particular combination of wavelengths could be chosen as the write beam and another different combination for the read beam, such that the correct information would only be revealed through a proper combination of wavelengths in the read beam (which may or may not involve a non-destructive read). Hence, the key to discovering the stored information would consist of the combination of the wavelengths and the relative intensity among the different wavelengths of the read beam.

Recording Sub-Micron-Sized Images

Because both the colorless photosensitive glass surface and the photo-dichroic glass surface are stable indefinitely under normal ambient lighting conditions, it is quite practical to make photo-dichroic areas or tracks for optical recording. For example, fine lines of photo-dichroic tracks having a micron or submicron width can be produced in the photosensitive glass surfaces through projection printing, contact printing, and, most preferably, holographic zone plate recording. Tracks in the form of concentric rings or spirals with equal spacings therebetween may be recorded in the surface of photosensitive glass discs via the projection of plane wave ultraviolet radiation through a circular-carrier hologram onto the glass surface.

In an initial evaluation of the resolution capability of the photosensitive glass surface, a resolution test target was contact printed in the surface of the photosensitive glass. FIG. 4 is a photomicrograph pictorially illustrating that ultraviolet radiation darkened test target. The distance between the bars in the set showing the highest spatial frequency is one micron. The bars are clearly resolved when viewed under a microscope. Two defect patches and several scratches are seen in the test target which were duplicated from a master which, unfortunately, had been previously damaged through contact with poorly polishd hard surfaces and/or masking tape. Because of the diffraction of the ultraviolet radiation by the test target of the master, the set of bars with the fourth highest frequency is smeared most seriously and up to 17 bars per set, instead of the 15 bars in the master, can be observed in the glass surface when examined under a microscope.

The MTF (Modulation Transfer Function) of the contact printer drops off at a spatial frequency of 4 microns/cycle, i.e., at the fourth highest frequency illustrated in FIG. 4. The MTF of the light microscope of the type employed in this study drops off at a spatial frequency of 2 microns/cycle, i.e., at a line width of one micron, the highest spatial frequency depicted in FIG. 4. Accordingly, it can be seen that the resolution capability of the photosensitive glass surface exceeds that of both the projection printer and the resolving power of the light microscope.

The photosensitive glass surfaces operable in the present invention are very sensitive to the 254 nm Hg line. Accordingly, continuous lines or dots having widths or diameters down to about 0.25 micron can be printed onto such glass surfaces. Therefore, inasmuch as only the ultraviolet darkened tracks or lines are photo-dichroic, a high density of sub-micron-sized lines or spots having sharp and well-defined transmitting edges (in the extinction read mode) can be recorded by utilizing a linearly-polarized red light write beam, the diameter of which is on the order of or somewhat larger than 1 micron in the focal plane thereof.

The formation (or pre-recording) of photo-dichroic areas or tracks through exposure of the photosensitive glass surface to ultraviolet radiation tends to increase the density of the images subsequently recorded via linearly-polarized red light. Moreover, because of the presence of such photo-dichroic areas or tracks, only a simple tracking control is required during recording instead of a precision slideway.

Preventing Later Alteration

Within the commonly known recording materials which are updateable, e.g., the commercially-available ablative thin films, 0-bits can always be converted into 1-bits after recording and any error corrections are made. Such alteration can be prevented in the present photo-dichroic glasses by flood-exposing the surface thereof to ultraviolet radiation after an image has been written therein.

After recording with a linearly-polarized write beam, the images resulting therefrom in the glass surface can be buried in a thicker photo-dichroic layer, e.g., up to 100 microns and more, through a flood exposure of the glass surface to ultraviolet radiation. In general, this exposure will be undetaken for a period of time sufficient to cause the formation of a photo-dichroic layer between the images and the thickening of the photo-dichroic layer along the images. Commonly, the depth of the photo-dichroic layer generated will be at least five microns. As a consequence, any subsequent recording or alteration cannot be sub-micron in dimension, i.e., the minimum spot size will be about 2-10 microns where the photo-dichroic layer ranges between about 5-100 microns. Furthermore, it has been discovered that the sensitivity of photo-dichroism exhibited by the glass surface is sharply reduced through excessive exposure to ultraviolet radiation. Thus, the writing sensitivity is less in the write beam image area than in the remainder of the glass surface. Moreover, the additional isotropic color centers resulting from the flood exposure absorb little in the near infrared portion of the radiation spectrum. Therefore, the flood exposure of ultraviolet radiation does not promote a significant attenuation of the read beam.

I claim:

1. In a method for writing and erasing images in the surface of a photosensitive glass which demonstrates alterable photo-anisotropic effects wherein an image is written into the surface of said glass through exposure thereof to a beam of linearly-polarized red light having a wavelength between about 600-650 nm and said image is erased from the surface of said glass through exposure thereof to a beam of linearly-polarized red light having a wavelength between about 600-650 nm and having a different orientation of polarization, the improvement comprising erasing said image with a beam of linearly-polarized red light having a wavelength between about 600-650 nm but with about a 45° change in the direction of polarization from said writing beam.

2. In a method according to claim 1 wherein said writing and erasing of images is conducted at a mega Hz or higher rate.

3. In a method according to claim 1 wherein the energy density for erasing is about 3-10 times that required for writing.

4. In a method according to claim 1 wherein said images are read via read modes derived with a deviation of $\theta_{WA}$ and/or $\theta_{PA}$ from those of the normal extinction modes whereby erased 1-bits can be distinguished from 0-bits.

5. A method for preventing the alteration of images written into the surface of a photo-dichroic glass which demonstrates alterable photo-anisotropic properties by exposing the surface of said glass to a beam of linearly-polarized red light having a wavelength between about 600-650 nm which comprises exposing said glass surface in the area of said images to ultraviolet radiation for a period of time sufficient to cause the formation of a photo-dichroic layer in the glass surface between said images and the thickening of the photo-dichroic layer along the images such that said images are buried in said photo-dichroic layer.

6. A method according to claim 5 wherein the thickness of said photo-dichroic layer is at least five microns.

* * * * *